(12) United States Patent
Eidschun (10) Patent No.: US 11,942,830 B2
(45) Date of Patent: Mar. 26, 2024

(54) ELECTRIC MOTOR MONITOR

(71) Applicant: Charles Douglas Eidschun, Clearwater, FL (US)

(72) Inventor: Charles Douglas Eidschun, Clearwater, FL (US)

( * ) Notice: Subject to any disclaimer, the term of this patent is extended or adjusted under 35 U.S.C. 154(b) by 0 days.

(21) Appl. No.: 17/818,824

(22) Filed: Aug. 10, 2022

(65) Prior Publication Data

US 2024/0055955 A1 Feb. 15, 2024

(51) Int. Cl.
| | | |
|---|---|---|
| *H02K 11/35* | (2016.01) | |
| *G01R 31/34* | (2020.01) | |
| *H02K 11/00* | (2016.01) | |
| *H02K 11/20* | (2016.01) | |
| *H02K 11/22* | (2016.01) | |
| *H02P 21/22* | (2016.01) | |

(52) U.S. Cl.
CPC ........... *H02K 11/20* (2016.01); *G01R 31/343* (2013.01); *H02K 11/35* (2016.01); *H02P 21/22* (2016.02)

(58) Field of Classification Search
CPC ......... H02K 11/20; H02K 11/35; H02P 21/22; G01R 31/343; G05B 23/0205
USPC ......... 702/57–58, 64–68; 361/23–24, 31–32, 361/93.1, 93.2, 93.9, 102
See application file for complete search history.

(56) References Cited

U.S. PATENT DOCUMENTS

| | | | | |
|---|---|---|---|---|
| 4,286,303 A | * | 8/1981 | Genheimer | H02H 7/08 361/103 |
| 4,839,830 A | * | 6/1989 | Amey | G01R 31/343 702/42 |
| 5,485,491 A | * | 1/1996 | Salnick | G07C 3/00 376/245 |
| 5,539,601 A | * | 7/1996 | Farag | H02H 6/005 361/33 |
| 5,982,120 A | * | 11/1999 | Akiyama | G11B 15/688 318/434 |
| 6,199,018 B1 | * | 3/2001 | Quist | G01M 13/045 706/912 |
| 6,295,510 B1 | * | 9/2001 | Discenzo | H02P 9/02 702/183 |
| 6,655,922 B1 | * | 12/2003 | Flek | F04D 29/669 73/1.37 |
| 6,839,660 B2 | * | 1/2005 | Eryurek | G05B 23/0229 702/65 |

(Continued)

*Primary Examiner* — Burton S Mullins
(74) *Attorney, Agent, or Firm* — Tiffany C. Miller; Inventions International Inc.

(57) ABSTRACT

An electric motor monitor having at least one sensor in electrical communication with a memory device and a motor. The memory device is configured to establish a performance baseline of the motor throughout its workload. The signal processing incorporates a memory device such as a microcomputer and/or a programmable logic controller configured to determine the work being performed by the motor by comparing the baseline performance of the motor throughout its work load to at least, the armature amperage of the motor. A wireless system transmits an operating motor's work parameters including, but not limited to, amperage, temperature, vibration, sound, rotation, power, moisture and/or voltage data, to a mobile or fixed base receiver. Data is accessible and viewable in real time. Alerts based on user-defined thresholds of the sensors are sent to an electronic device such as a tablet, a computer, and/or a smart phone.

2 Claims, 8 Drawing Sheets

(56) References Cited

U.S. PATENT DOCUMENTS

| | | | |
|---|---|---|---|
| 7,336,455 B2* | 2/2008 | Dimino | G05B 23/0229 |
| | | | 702/183 |
| 7,572,108 B2* | 8/2009 | Koehl | G05B 15/02 |
| | | | 417/44.11 |
| 8,144,438 B2* | 3/2012 | Rivers, Jr. | H02J 13/00017 |
| | | | 361/33 |
| 8,536,815 B2* | 9/2013 | Vicente | H02P 29/60 |
| | | | 318/473 |
| 9,071,110 B2* | 6/2015 | Lalonge | H02K 11/20 |
| 9,140,728 B2* | 9/2015 | Jayanth | F04B 51/00 |
| 9,270,108 B2* | 2/2016 | Hu | H02H 7/0811 |
| 9,337,707 B2* | 5/2016 | Dixon | H02K 11/33 |
| 10,181,774 B2* | 1/2019 | Waikar | H04B 5/0062 |
| 10,187,003 B2* | 1/2019 | Vinson | H02P 29/024 |
| 10,746,590 B2* | 8/2020 | Li | H02P 29/032 |
| 2019/0339688 A1* | 11/2019 | Cella | H04L 1/18 |
| 2021/0123443 A1* | 4/2021 | Davidson | H04W 84/18 |

* cited by examiner

| AMPS | FLOW | PRESSURE |
|---|---|---|
| 2 | 100 | 10 |
| 4 | 80 | 20 |
| 6 | 70 | 30 |
| 8 | 60 | 40 |
| 10 | 50 | 50 |
| 12 | 40 | 60 |
| 14 | 30 | 70 |

ELECTRIC MOTOR MONITOR

BACKGROUND OF THE INVENTION

1. Field of the Invention

This innovation relates, generally, to an electric motor monitor. More particularly, it relates to a system for monitoring work parameters such as, armature amperage, current, temperature, vibration, moisture, rotation, voltage, and sound, of an electric motor. A predetermined normal operating range of the electric motor is compared to real-time performance baseline data collected by the electric motor monitor. An alert is activated and sent directly to an electronic device, of a user, if the motor parameters are not within the predetermined normal operating range of the electric motor.

2. Background Art

Currently, motors are used for many applications including, but not limited to, industrial and/or domestic. In these applications, it is standard practice for the motor performance to be determined by using a sensor such as, a pressure transducer, a snap switch, and/or a flow meter placed at the point of operation. For example, U.S. Pat. No. 5,726,911 teaches an electric motor monitor. The monitor has an internal power source, electronics, sensors, and may be attached to the frame of a motor. The monitor detects flux, vibration, ambient temperature, motor frame temperature, and motor heating. A human operator would then be required to monitor the sensor on-site to determine if the normal operating condition of the motor exceeds or under performs the work required. This manual monitoring process by a user is time consuming and may be prone to human error if the sensor data is not monitored periodically and/or continuously. Further, this prior art motor monitor device does not have a program configured to establish normal baseline parameters of the motor which then sends an alert to an electronic device and/or disables motor operations if the motor monitor detects operations outside of the baseline parameters. Thus, there is a need to eliminate a human operator and/or a hard wired network when a motor's work performance is monitored. It would be more desirable for a wireless system to transmit the work parameter data of an operating motor to an electronic device including, but not limited to, a mobile phone, a tablet, and/or a computer.

Many systems exist that attempt to monitor motor work parameters. However, many of these systems require on-site collection of data derived from, in some instances, complex algorithms and models. For example, U.S. Pat. No. 11,239,783 teaches systems and methods for motor parameter extraction that includes a stator and a rotor. In particular, an excitation signal, such as a voltage drive, may be applied to the electric motor. A response signal, such as a current signal, may be sensed. A processor circuit is configured to measure a winding current from the electric motor in response to the applied drive voltage. One or more system parameters may be determined using one or more of the excitation signals or a response signal using a parametric model. In another example, U.S. Pat. No. 11,146,205 discloses methods for controlling electric motors, corresponding circuits, and computer program products. In particular, an electric motor current overload condition is monitored by a thermal increase of the value of the stator resistance of the electric motor. In yet another example, U.S. Pat. No. 10,670,016 teaches a pump monitoring apparatus and method having an electric motor with a current censor and an electronic processor. The current sensor generates a time-based signal and the electronic processor transforms via, Fourier Transform algorithm, the time-based signal to a frequency-based signal. A pump fault condition is characterized by a unique signal pattern. This signal pattern may be predefined and represents a known pump fault condition or a vibration signature. The sensor can monitor temperature of the pump, measure exhaust pressure of the pump, and/or measure the rotational speed of the rotational motor. Further, U.S. Pat. No. 6,042,265 teaches a sensor-less estimation of rotor temperature in induction motors. Computer calculations are derived from voltages and currents at the motor terminals from current and potential transformers already installed, to estimate the rotor temperature. All of these prior art motor monitoring devices do not have a program configured to establish normal baseline parameters of the motor which then sends an alert to an electronic device and/or disables motor operations if the motor monitor detects operations outside of the baseline parameters.

Many prior art motor performance monitors are powered by an external power source at a remote location from the motor. This may pose as a problem if the external power source fails and renders the motor monitor inoperable for its intended purpose. Thus, it is more desirable for the motor monitor to be directly powered by the motor. For example, U.S. Pat. No. 6,900,607 teaches a combined feedforward and feedback parameter estimation for electric machines. This motor parameter estimation method involves placing a temperature sensor, such as a thermocouple, a thermistor, a resistive thermal device, and/or a semiconductor at the switching device substrate, however, other locations are possible such as in or near the motor or the controller. A current sensor is operatively connected to an electric machine having an electric motor. In another example, U.S. Pat. No. 6,297,742 discloses a machine motor with a status indicator monitor. The monitor is attached to a machine and has its own internal power source, electronics, and sensors configured to monitor temperature, flux, and vibration. The monitor has a communications port configured to communicate monitor data with a computer or any portable data collector. An indicator receives alarm signals for anomalous machine conditions. The monitor may be attached directly to the motor. The sensors may be located external to the monitor. For example, the flux and vibration sensors may be incorporated within the motor. The outputs from these external sensors may wirelessly communicate with the monitor. Electric power for the monitor may be provided by one or more DC batteries and/or a Peltier device that includes a material which, when heated on one side and cooled on the other, produces electrical power. An alternate source of power for the monitor is a 120 volt power line can be connected to the monitor.

In another example, U.S. Pat. No. 6,262,550 discloses an electrical motor monitoring system on site at the motor. Sensors having direct motor contact include, but are not limited to, an accelerometer, a stray flux sensor, a radio frequency sensor, a microphone, a temperature sensor, a digital camera, and/or a laser are located at the motor. A monitoring unit at both the motor and at a remote motor control center are configured for synchronized timing signals for motor performance evaluation. Motor data collection is obtained by these monitors and an alarm/warning is generated when sensor signals exceed predefined ranges or when a predetermined motor condition occurs. A current sensing instrument records the motor current and is indicative of the motor condition. These prior art motor monitoring devices do not have a program configured to establish normal baseline parameters of the motor which then sends an alert to an electronic device and/or disables motor operations if the motor monitor detects operations outside of the baseline parameters.

Some prior art motor monitoring systems have an alarm that is activated once the associated motor under or overperforms its preset parameter. However, the monitoring process would more efficient if an alert was wirelessly transmitted to an electronic device such as a mobile phone, tablet, and/or a computer rather than an alarm sounding at the site of the motor monitor. For example, U.S. Pat. No. 5,852,351 teaches a machine monitor configured to detect temperature, flux, and vibration of a motor. The monitor may be attached to the motor at any location on, near, or proximate the motor frame. In one embodiment, the monitor retains the sensors. In a second embodiment, the sensors may be located external to the monitor as well. For example, flux and vibration sensors may be incorporated within the motor. The outputs from these external sensors within the motor may wirelessly transfer data to the monitor.

In another example, U.S. Pat. No. 8,981,697 discloses an asset condition monitoring system in an electric motor. It is known for motor conditions to be monitored such as, temperatures at the motor bearing, winding, and/or ambient; neutral current, phase current, phase voltage, and/or thermal capacity. The system monitors temperature, voltage, and current of an electric motor. An alarm may be triggered based on a predetermined threshold. Next, U.S. Pat. No. 5,917,428, teaches an integrated motor and diagnostic apparatus and method of operating the same. The diagnostic apparatus is integrated with the motor and includes a set of sensors, a processing unit, a memory, and a display device having an output interface for communicating alarms, warnings, and calculated operating parameter values to a remote operator. The motor and diagnostic unit include an electric motor having an output shaft connected to a load. The electric motor receives power from a remote power source through a set of power lead wires. In another example, U.S. Pat. No. 5,680,025 discloses a proactive motor monitoring system configured for collecting data pertaining to temperature, flux, and current data of a motor. Various areas of the motor may be measured for temperature such as the housing of the motor, a motor electrical junction box, a motor bearing, or on a shaft coupling associated with the motor. The temperature measuring device may be a thermocouple and/or an infrared thermometer. Data is transferred from the monitor of the motor to a portable data collector. Alarm limit thresholds are calculated based on the motor specifications and does not have a program configured to establish normal baseline parameters of the motor which then sends an alert to an electronic device and/or disables motor operations if the motor monitor detects operations outside of the baseline parameters.

Many motor monitoring systems are currently known to be connected to the power lead wires connecting the motor to a power source (U.S. Pat. No. 5,521,482). Operating parameters include, abnormal temperature, voltage, current, vibration, and phase imbalance. At least one sensor, such as a temperature sensor, a vibration sensor, sound sensor, moisture sensor, rotation sensor, and/or an air gap flux sensor, may be connected to the motor for sensing a condition. A processing unit is connected to the sensor and generates an abnormal motor operation signal when the determined first operating condition is within a predetermined range. A signal communicating unit wirelessly communicates the abnormal signal to another device. Some of the aforementioned prior art describes a motor monitor having at least one sensor placed on a motor and being capable of transmitting an operating motor's parameters to a mobile or fixed base receiver. Although many of these motor monitors described above provide operational awareness of the current state of the motor having alarms provided when preset parameters are met, they do not teach having a program configured to establish normal baseline parameters of the motor which then sends an alert to an electronic device and/or disables motor operations if the motor monitor detects operations outside of the baseline parameters.

However, in view of the prior art considered as a whole at the time the present invention was made, it was not obvious to those of ordinary skill in the pertinent art how the identified needs could be fulfilled.

SUMMARY OF THE INVENTION

The long-standing but heretofore unfulfilled need for an electric motor monitor having at least one sensor in electrical communication with a memory device and a motor. The memory device is configured to establish a performance baseline of the motor throughout its workload. The signal processing incorporates a memory device such as a microcomputer and/or a programmable logic controller configured to determine the work being performed by the motor by comparing the baseline performance of the motor throughout its work load to at least, the armature amperage of the motor. It is within the scope of this invention for the predetermined baseline performance to be established by data provided by, for example, a manufacturer on a specification sheet for a specific application. A wireless system transmits an operating motor's work parameters including, but not limited to, amperage, temperature, vibration, sound, rotation, power, moisture and/or voltage data, to a mobile or fixed base receiver. Data is accessible and viewable in real time. Alerts based on user-defined thresholds of the sensors are sent to an electronic device such as a tablet, a computer, and/or a smart phone, and which also includes improvements that overcome the limitations of prior art electric motor monitoring systems is now met by a new, useful, and non-obvious invention.

An electric motor receives power from a power system and/or a power source through a set of power lead wires. The electric motor monitor connects to an outer wall surface of the electric motor. The electric motor is mechanically connected to a load which may be any piece of driven equipment including, but not limited to, a pump. At least one and/or a plurality of motor sensors are electrically connected to the motor. The motor sensors are electrically connected to an electronic motor monitoring device having a memory device including, but not limited to, a microcomputer, and/or a programmable logic controller configured for signal processing. The monitor is configured to sense, analyze, and store motor operating parameters. It is within the scope of this invention for the monitor to have a housing retaining the electrical components. The monitor may have a mounting structure connecting the monitor to the motor. It is within the scope of this invention for the monitor to directly connect to the motor, the mounting structure of the monitor may connect to the motor, the monitor may be electrically connected to the motor, and/or the monitor may be electrically connected to the power source of the motor. The monitor is powered by the motor itself independent of external power and/or batteries.

It is within the scope of this invention for the monitor to have a memory device including, but not limited to, a microcomputer and/or a programmable logic controller. The memory device is electrically connected to at least one sensor and/or a plurality of sensors configured to collect data associated with motor operating parameters. In particular, a sensor signal corresponds to a parameter detected. Signal processor circuitry receives and processes the sensor signal and generates an associated motor operating parameter. Motor operating parameters and/or alerts are transmitted to an electronic device. In particular, a textual message, a raw parameter data value, and/or a plot of the temperature, current, and/or voltage values are displayed on a display screen of an electronic device such as a supervisory computer, tablet, smart phone, and/or mobile phone. The electronic motor monitoring device includes a printed circuit having a current signal processor, memory device, and Wi-Fi board in electrical communication with at least one sensor for generating an RF communication link signal capable of delivering sensor signal data to a remote electronic device. In an example, a motor voltage sensor and a motor current sensor are connected directly to the power lead wires connecting the electric motor to a source of power.

It is within the scope of this invention for the motor work to be characterized by the collection of data centered around the armature amperage, the motor temperature, and other data points such as, rpm, noise, vibration, sound, and/or moisture and for the collected data of the monitor to be wirelessly displayed on a remote device. In particular, a unique signal processing is implemented as it would be more desirable for the signal processing to incorporate a microcomputer configured to determine the work being performed by the motor by comparing the baseline performance of the motor throughout its work load to at least, the armature amperage of the motor. As a result, the novel electric motor monitor provides operational awareness of the current state of the motor as it is operating to ensure that the motor is functioning within its predetermined normal operating range. In particular, the motor work is characterized by the collection of data derived from the armature amperage, the motor temperature, and other data points. It is within the scope of this invention for these aforementioned data points to include, but not be limited to, revolutions per minute, noise, vibration, sound, and moisture according to the application of the motor. The data collected by the invention is configured to have a wired and/or wireless electrical communication with an electronic device having a screen or not having a screen including, but not limited to, a remote device, a mobile phone, a computer, a tablet, a central monitoring computer.

It is within the scope of this invention for the electronic device to have application software configured to receive motor data, to convert the data into useful parameters, to display the useful parameters on a user interface of an electronic device having a screen or not having a screen, and to provide an alarm and/or an alert to a user through the electronic device when the motor parameters are out of a predetermined range. It is within the scope of this invention for any interface to include, but not be limited to, a graphic user interface. In an alternate embodiment, a plurality of motors having a plurality of applications may be monitored with the novel electric motor monitor during use, for example, throughout the workplace. It is within the scope of this invention for the novel motor monitor to have a program configured to establish normal baseline parameters of the motor which then sends an alert to an electronic device and/or disables motor operations if the motor monitor detects operations outside of the baseline parameters. For example, a user may access the software application on a smart phone and receive an alert that the motor monitor has detected motor operations outside of the baseline parameter. The software application may be in electrical communication with a current interruption device configured to open the circuit if the motor monitor detects operations outside of normal baseline parameters. A user may manually press an icon and/or button on the user interface of the software application while the alarm of the software application is activated to disable and/or power off and/or to reset the motor to prevent damage to the system. In another embodiment, the alarm of the software application is automatically activated to disable and/or power off and/or reset the motor to prevent damage to the system.

It is within the scope of this invention for a hardware and/or a software system to be configured to monitor motor work and display predetermined parameters to a remote monitoring device such as an electronic device using any communication method including, but not limited to, wired and/or wireless network protocols, Wi-Fi, and/or Bluetooth. It is within the scope of this invention for this hardware system to utilize a current transformer and/or current sensor configured to monitor armature amperage. A microcomputer and/or programmable logic controller type device may be configured to convert the motor amperage to data. The data is then converted to useful operational information. It is within the scope of this invention for a wireless device to be configured to transmit data derived from a motor's armature amperage to a remote monitor. In another embodiment, it is within the scope of this invention for a hardware and/or a software system to be configured to monitor parameters related to the and/or function including, but not limited to, armature amperage, temperature of the motor rotation failure, vibration of the motor, sound, and/or moisture, and display the monitored parameters to a remote device such as an electronic device using any communication method including, but not limited to, wired and/or wireless network protocols, Wi-Fi, and/or Bluetooth.

An important aspect of the current invention is the motor parameters that may be monitored include, but are not limited to, anything that may be interfaced with the microcomputer and/or programmable logic controller, analogue motor amperage, analogue temperature, analogue or digital vibration, analogue or digital sound, analogue rotation, analogue or digital power applied to the motor, analogue or digital moisture, and/or motor voltage. It is within the scope of the invention for current transformers and/or current sensors to be used with the novel electric motor monitoring system when monitoring the motor's armature amperage.

The microcontroller software is configured to map the normal operations of a specific electric motor which establishes normal load conditions throughout the normal range of operation of that specific electric motor. The microcomputer is configured to determine a baseline performance of the motor throughout its work load. The armature amperage is then compared to the baseline to determine the work being performed. In an example, the baseline curve of the motor amperage throughout its work load is scaled from 0 amps for no work to 100 amps for maximum work. It is within the scope of this current invention for the work load to be scaled from any minimum value for the amps for no work to any maximum value of amps for maximum work depending on the size and/or type of motor. This scaling of the performance in useful parameters including, but not limited to, gallons per minute, pounds per square inch, feet per minute, and/or miles per hour, allows for tracking along a graphed curve. The current is measured in amps (amperes). The actual motor amperage during operation is compared to the scaled baseline curve to produce the performance numbers in real time. These performance numbers may be displayed to a user on an electronic device. When the electric motor being monitored has a variation from its normal operating range, an alert is activated and sent to an electronic device to be viewed by a user.

It is within the scope of this invention for an armature to be a component of an electric motor configured to carry alternating and/or direct current. Commutator action or electronic commutation facilitate the armature windings to conduct alternating current. It is currently known for an electric machine to have an armature being a rotor or a stator configured to generate an electromotive force and to carry current. Armature windings are in communication with a magnetic field produced by permanent magnets or electromagnets of a conducting coil.

In a preferred embodiment, the novel electric motor monitor has at least one sensor in electrical communication and/or electrically connected to a memory device. It is within the scope of this invention for the memory device to include, but not be limited to, a microcomputer and/or a programmable logic controller. In another preferred embodiment, novel electric motor monitor has a memory device configured to receive and store a predetermined operational baseline of at least one parameter of a host motor. For example, an operator and/or a user manually enters in the application values of a parameter set forth by the manufacturer of including, but not limited to, a load, an application, and/or a host motor. The memory device is configured to monitor at least one parameter of the host motor during operation. It is within the scope of this invention for at least one sensor of the electric motor monitor device to detect at least one parameter of the host motor including, but not limited to, motor amperage, temperature, vibration, sound, rotation, power, moisture, and/or voltage.

The memory device is configured to compare at least one parameter of the host motor to the predetermined operational baseline of at least one parameter of the host motor. The memory device is configured to send an alert to an electronic device when an irregularity to the predetermined operational baseline of the host motor is detected. It is within the scope of this invention for any alert to include, but not be limited to, at least one of an alarm, a call, audio sound, text, a vibration, and/or a visual light indicator.

In an alternate embodiment, the novel electric motor monitor has a memory device configured to collect raw data from the host motor and then converts the raw data of the host motor into useful data of the performance baseline using a subroutine.

In another alternate embodiment, the memory device of the novel electric motor monitor is electrically connected to a current interruption device. The current interruption device is electrically connected to a power source. It is within the scope of this invention for the power source to be any source of power including, but not limited to, electrical transmission lines (mains electricity), electromechanical systems (alternators and generators), solar power, and/or storage devices including, but not limited to, cells and batteries. The source of electrical power may be AC and/or DC. The current interruption device is configured to be oriented in an opened orientation when the novel electric motor monitor detects operations outside of at least one or a plurality of baseline parameters.

In yet another alternate embodiment, the novel electric motor monitor has an electronic device in electrical communication and/or electrically connected with a memory device. The electronic device may have a screen with a user interface. The user interface has a button configured to be pressed by a user when an active alert is received by a user. For example, then the baseline operating parameters have been detected to be irregular because they are not within the predetermined range, the operator and/or user may decide to turn the motor "off" to avoid damage to the system. So, at a point when a user receives an alert by the electronic motor monitor, if the user presses the "deactivate" button of the electronic device, the current interruption device will be oriented in an opened orientation when the electric motor monitor detects operations outside of baseline parameters of the host motor. If there is no power supplied to the motor during the current interruption device being oriented in an opened orientation, then the motor will turn "off", which is desirable.

BRIEF DESCRIPTION OF THE DRAWINGS

For a fuller understanding of the nature and objects of the invention, reference should be made to the following detailed description, taken in connection with the accompanying drawings, in which.

DETAILED DESCRIPTION OF THE PREFERRED EMBODIMENT

Many aspects of the embodiments described may be illustrated as software components used herein, a software component includes, but is not limited to, any type of computer instruction or computer executable code in communication with a memory device and/or transmitted electronically over a system bus, a wired network, and/or a wireless network.

Figure 1:
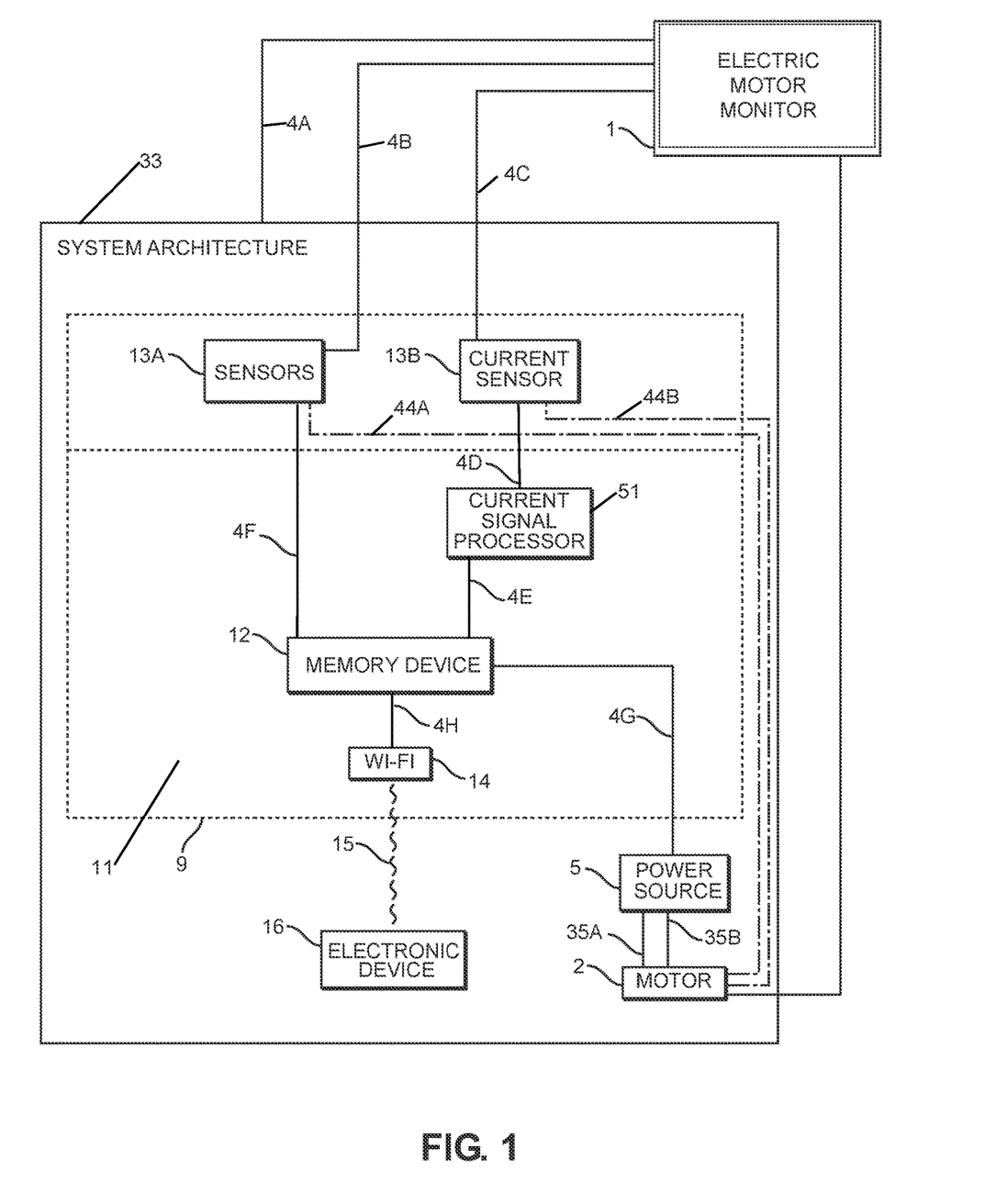
FIG. 1 is a box diagram of the system architecture of the novel electric motor monitor having a sensor connected to a printed circuit board.
Figure 5:
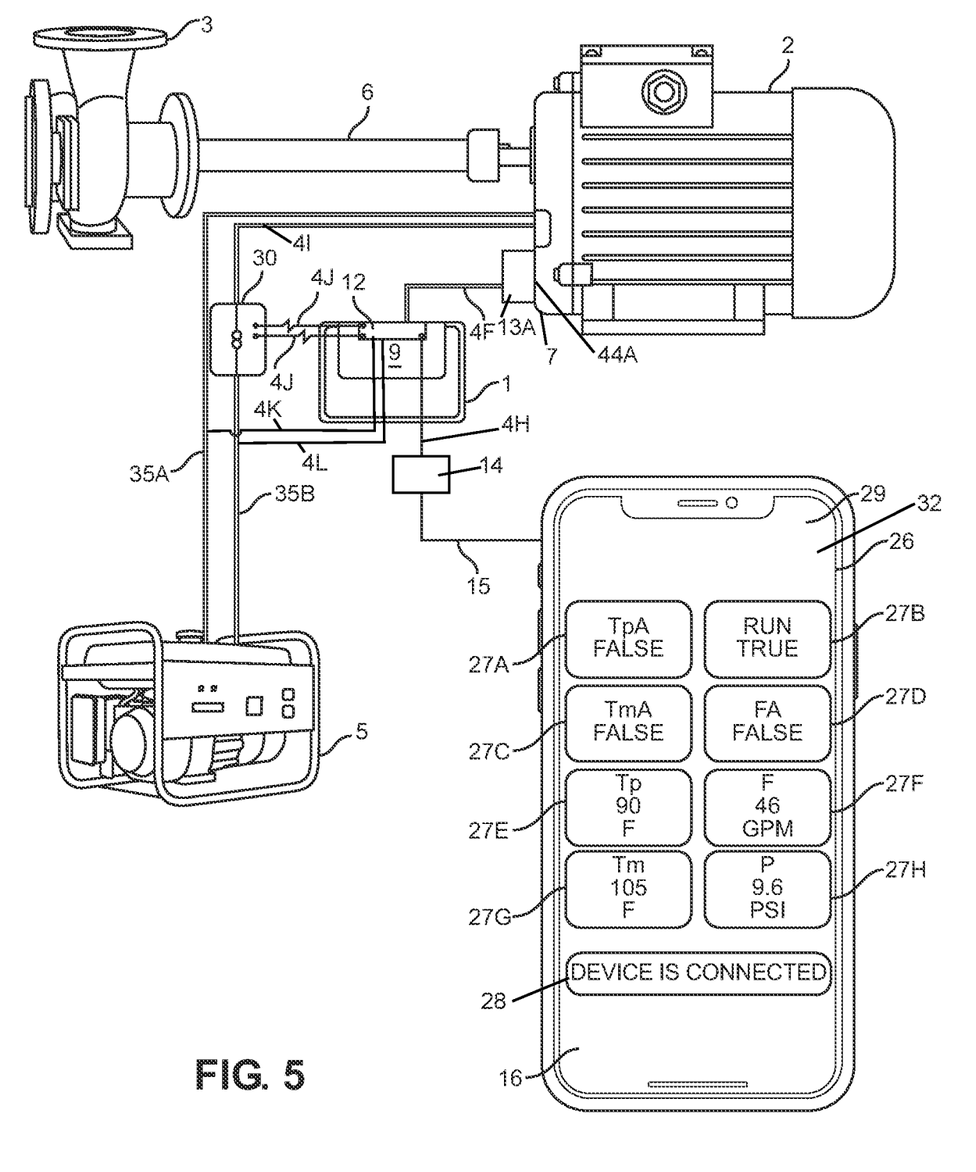
FIG. 5 is a perspective view of an AC motor wired by Line 1 and Line 2 to a power source and having a current interruption device oriented in a closed orientation when the motor monitor operates within a normal baseline parameter.
Figure 6:
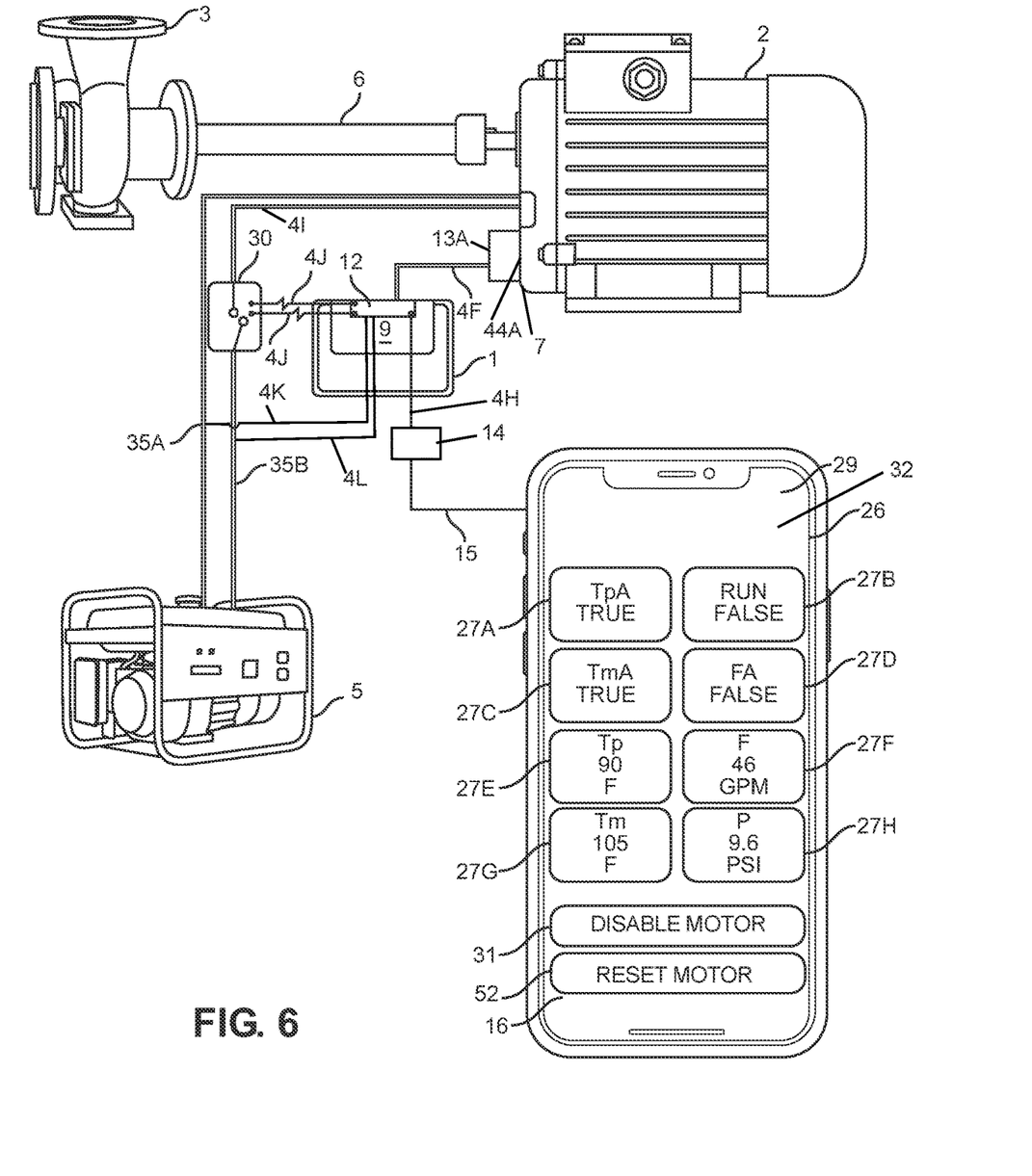
FIG. 6 is a perspective view of an AC motor wired by Line 1 and Line 2 to a power source and having a current interruption device oriented in an open orientation when the motor monitor operates outside of a normal baseline parameter.

At 4A (FIG. 1) of FIGS. 1 and 5-6, electric motor monitor 1 is electrically connected to system architecture 33 (FIG.

1). At 4B, FIG. 1 best illustrates at least one sensor 13A is electrically connected to electric motor monitor 1. At 4C (FIG. 1), current sensor 13B is electrically connected to electric motor monitor 1. At 4D (FIG. 1), current sensor 13B is electrically connected to current signal processor 51. At 4E (FIG. 1), current signal processor 51 is electrically connected to memory device 12. At 44B (FIG. 1), current sensor 13B is in communication with motor 2. At 44A (FIGS. 1 and 5-7), at least one sensor 13A is in communication with motor 2. Printed circuit board 11 (FIG. 1) retains electrical components 9 (FIG. 1) including, but not limited to, communication system 14 (FIG. 1), memory device 12, and current signal processor 51 (FIG. 1). Monitor 1, motor 2, power source 5, electronic device 16, sensor 13A, and/or current sensor 13B (FIG. 1) are located external to printed circuit board 11 (FIG. 1). It is within the scope of this invention for at least one sensor and/or power source to be mounted on printed circuit board 11 (not shown). System architecture 33 (FIG. 1) includes, but is not limited to, electrical components 9. It is within the scope of this invention for electrical components 9 to include, but not be limited to, at least one sensor 13A and/or current sensor 13B (FIG. 1) that is in electrical communication and/or electrically connected to printed circuit board 11 (FIG. 1).

FIGS. 1 and 5-6 show electrical components 9 include printed circuit board 11 (FIG. 1) having memory device 12 being including, but not limited to, a programmable logic controller and/or a microcontroller. At 4G (FIG. 1), memory device is electrically connected to power source 5 of motor 2. In particular, FIGS. 1 and 5-6 illustrate power source 5 is connected to motor 2 with line 1 35A and line 2 35B. Line 1 35A has one end connected to power source 5 located opposite another end of line 1 35A connected to motor 2. FIGS. 5-6 show line 2 35B has one end connected to power source 5 located opposite another end connected to current interruption device 30. FIG. 5 illustrates current interruption device 30 being oriented in a closed orientation to provide power to motor 2. It is within the scope of this invention for a current interruption device to include, but not be limited to, a relay. At 4I (FIGS. 5-6), current interruption device 30 is electrically connected to motor 2. At 4J (FIGS. 5-6), current interruption device 30 is electrically connected to memory device 12 of electric motor monitor 1. At 4G (FIG. 1), memory device 12 is electrically connected to power source 5. At 4K, FIGS. 5-6 show memory device 12 being electrically connected to line 35A and at 4L, being electrically connected to line 35B. At 4K, FIG. 7 shows memory device 12 being electrically connected to line 35A and at 4M, being electrically connected to neutral 37.

Figure 7:
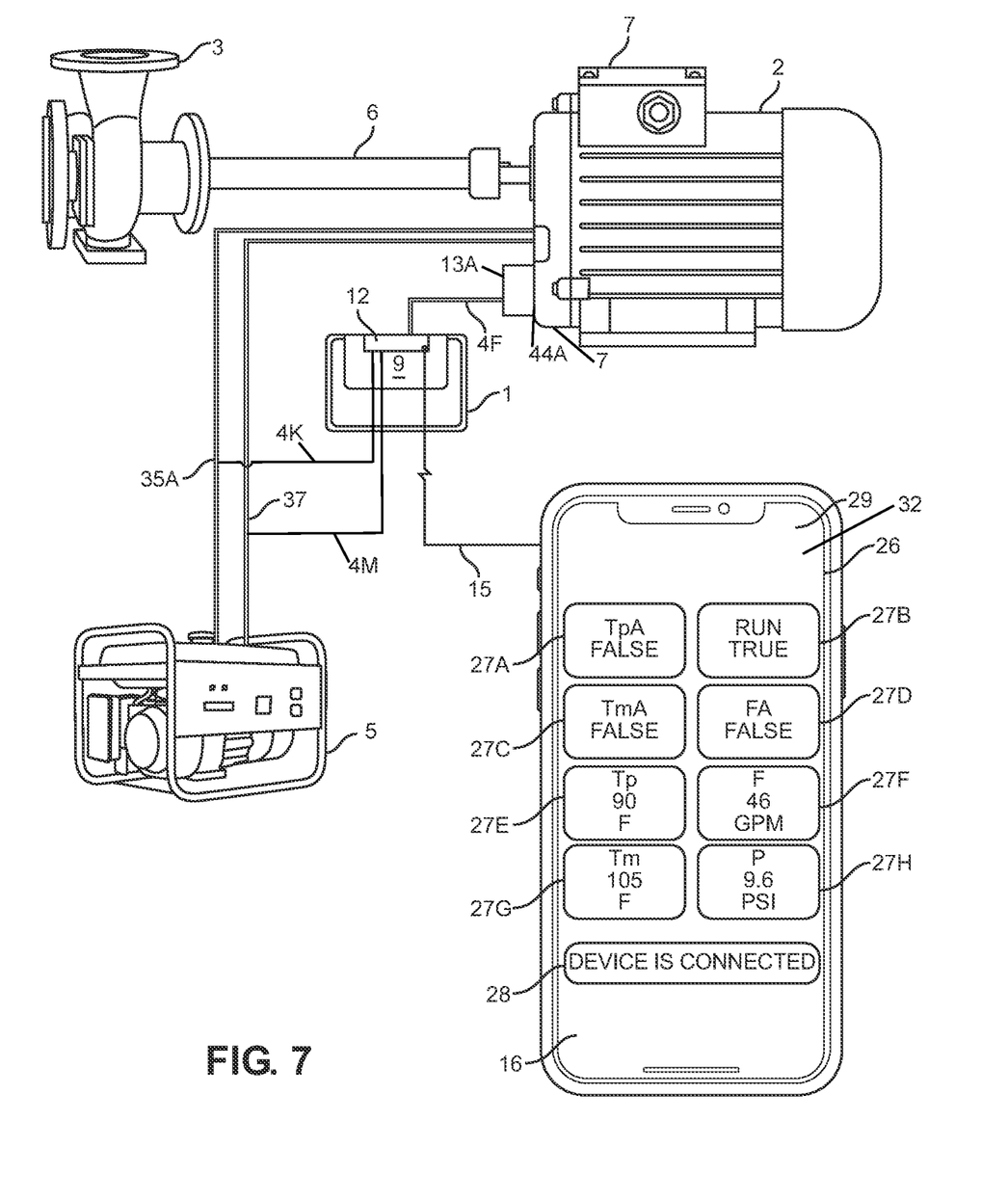
FIG. 7 is a perspective view of an AC motor wired by Line 1 and Neutral to a power source and having a motor monitor in electrical communication with a motor and an electronic device having a software application configured for establishing a normal baseline parameter and alerting a user when operations are detected to be outside of the baseline parameters.

At 4F, FIGS. 5-7 show memory device 12 being electrically connected to sensor 13A. At 44A, sensor 13A is in communication with outer wall surface 7 of motor 2. At 6, motor 2 is mechanically connected to load 3. At 4H, memory device 12 is electrically connected to communication system 14. At 15, communication system 14 (FIG. 1) of electrical components 9 are in communication with electronic device 16. It is within the scope of this invention for communication system 14 to be in a wired (not shown) and/or wireless communication 15 (FIG. 1) such as Wi-Fi, and/or Bluetooth with electronic device 16. It is within the scope of this invention for electronic device 16 to include, but not be limited to, a computer, a smart phone, a tablet, and/or a phone.

FIGS. 5 and 6 show the method for monitoring the condition of an electric motor may have the step of providing current interruption device 30. Memory device 12 of electric motor monitor 1 is electrically connected 4J to current interruption device 30. Current interruption device 30 is electrically connected 35B to power source 5. Current interruption device 30 is configured to be oriented in an opened orientation (FIG. 6) when electric motor monitor 1 detects operations outside of baseline parameters, whereby, current interruption device 30 is oriented in an opened orientation (FIG. 6) when electric motor monitor 1 detects operations outside of baseline parameters of host motor 2. Electric motor monitor 1 may have electronic device 16 in electrical communication 15 with memory device 12 of electric motor monitor 1. Electronic device 16 has screen 26 with user interface 32. User interface 32 has icon and/or button 31 (FIG. 6) configured to be pressed and/or touched by a user 50 (FIG. 8) when an active alert is received by a user through electronic device 16, thereby orienting current interruption device 30 to be oriented in an opened orientation (FIG. 6) when electric motor monitor 1 detects operations outside of baseline parameters of host motor 2. As a result, host motor 2 is disabled and/or reset. It is within the scope of this invention for the application software of electronic motor monitor 1 to be programmed to automatically disable and/or reset host motor 2 when an alert is activated in response to a detected irregularity of operations outside of baseline parameters of host motor 2.

Figure 2:
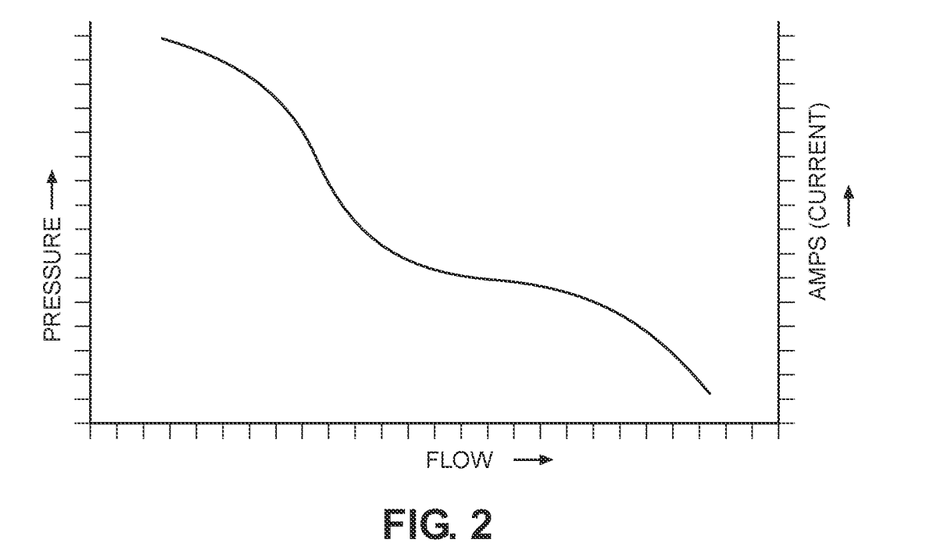
FIG. 2 illustrates a plot of the relationship between flow, pressure, and motor current in an electric motor in a pump configuration.

Referring again to FIG. 1, sensor 13A includes, but is not limited to, temperature, voltage, sound, vibration, motor amperage, moisture, and/or power. Further, sensor 13B is a current sensor electrically connected 4D to current signal processor 51. Current signal processor 51 is electrically connected 4E to memory device 12. Sensor 13A is electrically connected to 4B electric motor monitor 1. Sensor 13B is electrically connected to 4C electric motor monitor 1. Sensor 13A is in communication with 44A motor 2. Sensor 13B is in communication with 44B motor 2. Referring now to FIG. 2, a chart shows the relationship between flow, pressure, and motor current for a common centrifugal pump. The motor monitor device is configured to measure motor current. An application specific scale is utilized to display the flow and pressure of any motor and/or work system including, but not limited to, a pump.

Figure 3:
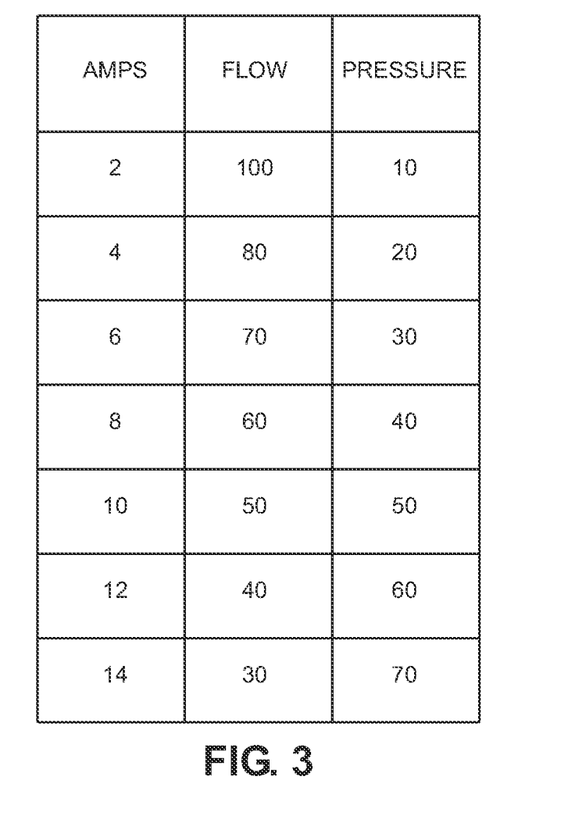
FIG. 3 illustrates a plot of the relationship between amps, flow, and pressure for a pump.

FIG. 3 illustrates a chart showing the relationship between Amps flow and pressure for a pump curve. The Amps are measured by the current signal processor. Amps are related to flow plus the pressure. The signal from the current signal processor is measured by the memory device including, but not limited to, a programmable logic controller, and/or a microcomputer. The memory device is configured to scale the signal to the motor curve and display the results including, but not limited to, flow and/or pressure, through a wired and/or wireless network including, but not limited to, a WiFi connection, to any electronic device including, but not limited to, a cellphone, a smartphone, a tablet. It is within the scope of this invention. It is within the scope of this current invention for the novel scaling software of the motor monitor to not require a linear curve. In particular, each motor and/or work relationship has its own curve and the scaling is a result of the established curve. Points on the curve are related to flow and pressure of, for example, a pump. These points are displayed accordingly on a wireless device that has been paired with the motor monitor.

Figure 4:
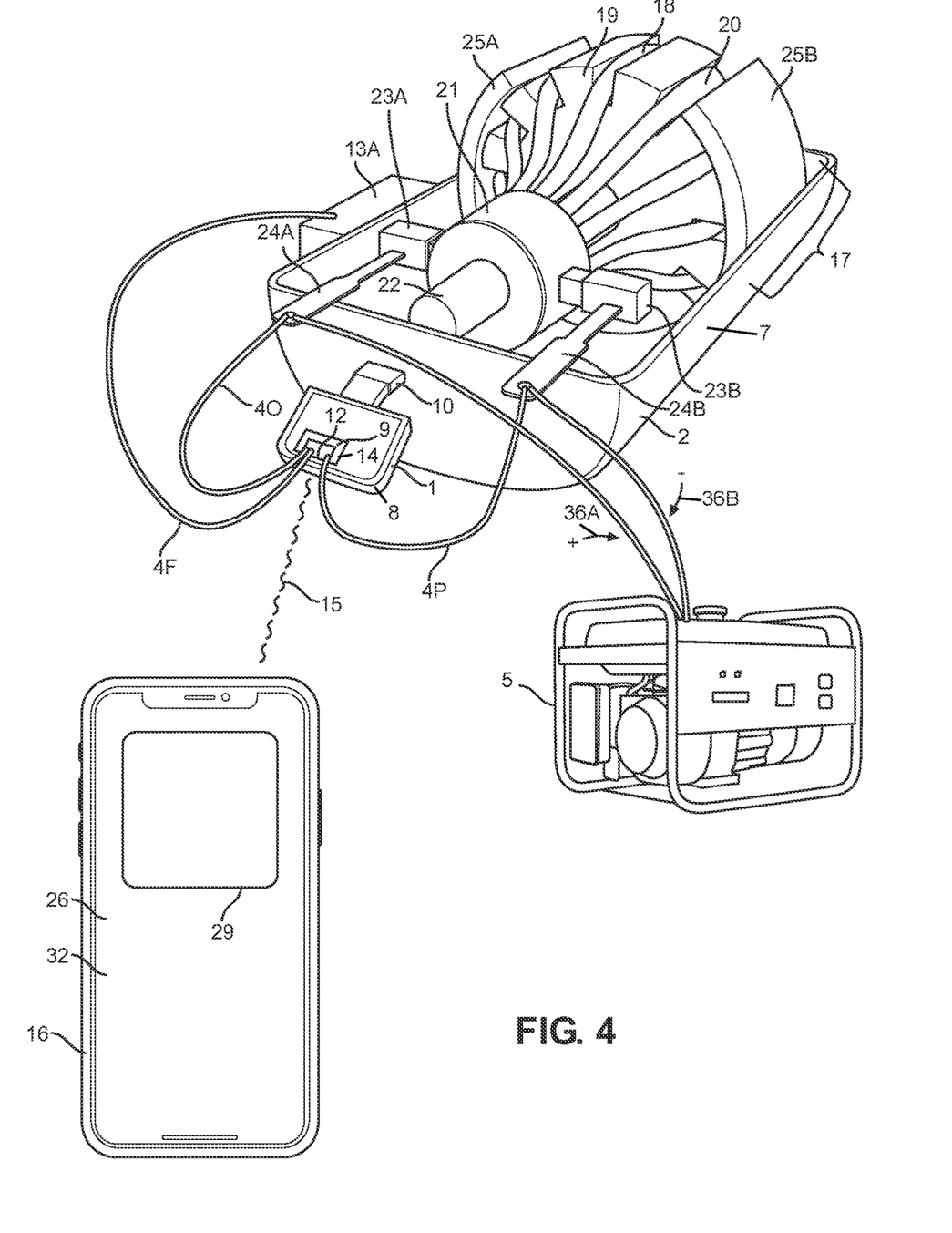
FIG. 4 is a sectional view of a brushed electric DC motor electrically connected to the novel motor monitor which is in wireless communication with an electronic device.

FIG. 4 illustrates motor 2 being a brushed electric DC motor. Motor 2 is mechanically connected 6 to load 3 (FIG. 5). Motor 2 has armature stack 17 with stack tooth 19 and stack slot 18. Coil winding 20 is retained within stack slot 18. Motor 2 has commuter bar 21 with armature shaft 22. Motor 2 has stator magnets 25A and 25B. Brush 23A has terminal 24A. Brush 23B has terminal 24B. Sensor 13A is connected to outer wall surface 7 of motor 2 and/or may be in close proximity to motor 2 and/or may be mounted on a base connected to outer wall surface 7 of motor 2 and/or be mounted anywhere within the motor housing.

Referring again to FIG. 4, memory device 12 has electrical components 9. Electric motor monitor 1 has housing 8 configured to retain electrical components 9. Memory device 12 of electric motor monitor 1 is electrically connected 40 to terminal 24A of brush 23A and is electrically connected 4P to terminal 24B of brush 23B. Communication system 14 of memory device 12 is in communication 15 with electronic device 16. It is within the scope of this invention for electric motor monitor to be mounted to a housing of motor 2 with a mounting structure 10 such as a base. Electric motor monitor 1 may be in a remote location from motor 2. Power source 5 has negative line electrically connected 36B to terminal 24B of brush 23B. Power source 5 has positive line electrically connected 36A to terminal 24A of brush 23A. Electronic device 16 has screen 26 that may be a touch screen. Electronic device 16 has application 29 that is displayed to a user (not shown) through user interface 32 of electronic device 16. At least one sensor 13A is electrically connected to 4F memory device 12.

FIGS. 5 and 7 illustrates electronic device 16 having screen 26 and user interface 32 configured for a user (not shown) to monitor motor parameters 27A-27H through software application 29. TpA is text listed on chart and/or icon 27A to denote the pump pressure being too high or too low being false. So, no alert is activated when the normal operating parameters are detected and displayed as being within the baseline parameters. TmA is text listed on chart and/or icon 27C to denote the motor amperage being too high as false. So, no alert is activated when the normal operating parameters are detected and displayed as being within the baseline parameters. Run is text listed on chart and/or icon 27B to denote the pump is operating as required being true. So, no alert is activated when the normal operating parameters are detected and displayed as being within the baseline parameters. FA is text listed on chart and/or icon 27D to denote pump failure as being false. So, no alert is activated when the normal operating parameters are detected and displayed as being within the baseline parameters. Tp is text listed on chart and/or icon 27E to denote the process temperature being 90° F. So, no alert is activated when the normal operating parameters are detected and displayed as being within the baseline parameters. Tm is text listed on chart and/or icon 27G to denote the motor temperature as being 105° F. So, no alert is activated when the normal operating parameters are detected and displayed as being within the baseline parameters. F is text listed on chart and/or icon 27H to denote the pump flow being 46 gallons per minute. So, no alert is activated when the normal operating parameters are detected and displayed as being within the baseline parameters. P is text listed on chart and/or icon 27H to denote the motor pump flow pressure being 9.6 pounds per square inch. So, no alert is activated when the normal operating parameters are detected and displayed as being within the baseline parameters.

FIGS. 5 and 7 depict electronic device 16 having software application 29 accessible to a user (not shown) through user interface 32 on screen 26. Parameters 27A-27H are displayed to a user (not shown) through user interface 32. Connection status 28 reads text, "Device is connected" and is displayed on user interface 32 to indicate if motor monitor 1 is in communication 15 with electronic device 16. Electronic device 16 may be in wired connection and/or wireless communication with motor monitor 1. Motor monitor 1 has electrical components 9. Memory device 12 of electrical components 9 may be electrically connected to current interruption device 30 (FIGS. 5-6). Memory device 12 of electrical components 9 is electrically connected to 4K and 4L lines 35A and 35B, respectively. Memory device 12 of electrical components 9 is electrically connected 4F to at least one sensor 13A. At least one sensor 13A may be connected to outer wall surface 7 of motor 2 and/or be connected to a base (not shown), whereby, the base is connected to motor 2. It is within the scope of this invention for memory device to have electrical connection 4K to line 1 35A (FIGS. 5-6) and electrical connection 4L being line 2 35B (FIGS. 5-6). It is also within the scope of this invention for memory device 12 to have electrical connection 4K to line 1 35A (FIG. 7) and to have electrical connection 4M to Neutral 37 (FIG. 7). It is within the scope of this invention for power source 5 to have electrical connection being line 1 35A (FIGS. 5-6) and electrical connection being line 2 35B (FIGS. 5-6). It is also within the scope of this invention for power source 5 to have electrical connection being line 1 35A (FIG. 7) and to have electrical connection being Neutral 37 (FIG. 7) being electrically connected to motor 2. Motor 2 is mechanically connected 6 (FIGS. 5-7) to load 3. It is within the scope of this invention for mechanical connection 6 to be a shaft.

FIG. 5 illustrates current interruption device 30 being oriented in a closed orientation to close the circuit. When the circuit is closed, power source 5 is in electrical communication with motor 2. In an example, when motor monitor 1 detects operations within normal baseline parameters, the circuit will remain in a closed orientation (FIG. 5). When the circuit is open, power source 5 is not in electrical communication with motor 2. In an example, when motor monitor 1 detects an irregularity of operations outside of normal baseline parameters, the circuit may be opened automatically or by a user's communication with software application 29. In particular, a user may be alerted of an irregularity of operations outside of normal baseline parameters by an audio alarm and/or vibrations of electronic device 16.

FIG. 6 illustrates electronic device 16 having user interface 32 having parameters 27A-27H displayed on screen 26. The TpA icon 27A shows that the pump pressure being too high or low is true. Tpa is text listed on chart, button, and/or icon 27A to denote the pump pressure being too high or too low being true. So, an alert is activated when the normal operating parameters are detected and displayed as being outside the baseline parameters. TmA is text listed on chart, button, and/or icon 27C to denote the motor amperage being too high as true. So, an alert is activated when the normal operating parameters are detected and displayed as being outside the baseline parameters. Run is text listed on chart, button, and/or icon 27B to denote the pump is operating as required being false. So, an alert is activated when the normal operating parameters are detected and displayed as being outside the baseline parameters. While the alarm is activated, a user may hear the audio alarm and/or feel the vibration and/or see the alert lights emitted from electronic device 16 and touch a "Disable Motor" button and/or icon 31 (FIG. 6) or touch a "Reset Motor" button and/or icon 52 on user interface 32 of electronic device 16. When the "Disable Motor" icon 31 is activated, current interruption device 30 is oriented in an open configuration (FIG. 6) to open the circuit to disable motor 2.

Figure 8:
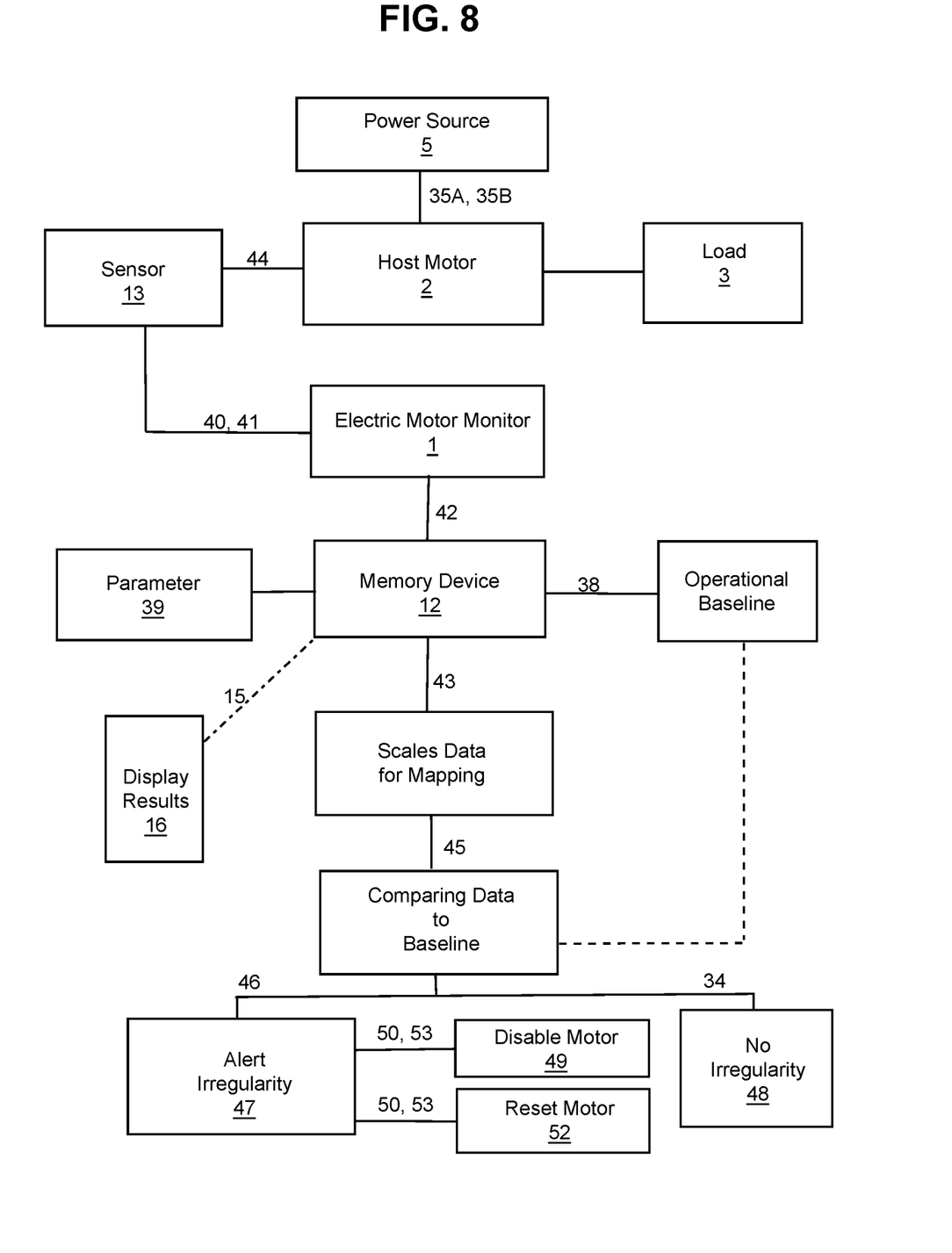
FIG. 8 is a box diagram of the steps of the method of using the novel motor monitoring system; and, FIG. 9 is a scale converting the monitored raw armature data into a pressure value that is displayed on a user interface of an electronic device.

Referring now to FIG. 8, a system for monitoring parameters of an electric motor has the step of providing a host motor 2. Host motor 2 is electrically connected to power source 5 with lines 35A and 35B in this example, however, it is understood that this embodiment is not limited to this specific configuration. Providing electric motor monitor 1. Electric motor monitor 1 has at least one sensor. At least one sensor is in electrical communication with a memory device. The memory device is configured to receive and store a predetermined operational baseline of at least one parameter 39 of host motor 2. A user inputs 38 the predetermined operational baseline value and/or range of values into the memory device of the electric motor monitor through an electronic device. The memory device is configured to monitor at least one parameter of the host motor during operation. Sensor 13 monitors 40 and collects 41 raw data from at least one parameter 39 of host motor 2. The memory device is configured to compare at least one parameter of the host motor to the predetermined operational baseline of at least one parameter of the host motor. The memory device is configured to send an alert to an electronic device when an irregularity to the predetermined operational baseline of the host motor is detected.

FIG. 8 shows power source 5 is connected to host motor 2. At least one sensor 13 is connected 44 to host motor 2. Memory device 12 collects 41 raw data from at least one parameter 39 of host motor 2 and generates 42 a signal from raw data, whereby, the signal is scaled 43 into a mapping of data to compare 45 to the predetermined operational baseline of at least one parameter 39 of host motor 2. Providing electronic device 16. Electronic device 16 is in wireless communication 15 with memory device 12 of electric motor monitor 1. Providing a load 3. Load 3 mechanically coupled 6 to host motor 2. The memory device sending 46 an alert to the electronic device when an irregularity to the performance baseline of the host motor is detected 47. If an irregularity to the performance baseline of the host motor is not detected 48 an alert will not be sent 34 to the electronic device. Disabling 49 and/or resetting 52 electric motor 1 when an alert is received by the electronic device either manually 50 or automatically 53.

Figure 9:
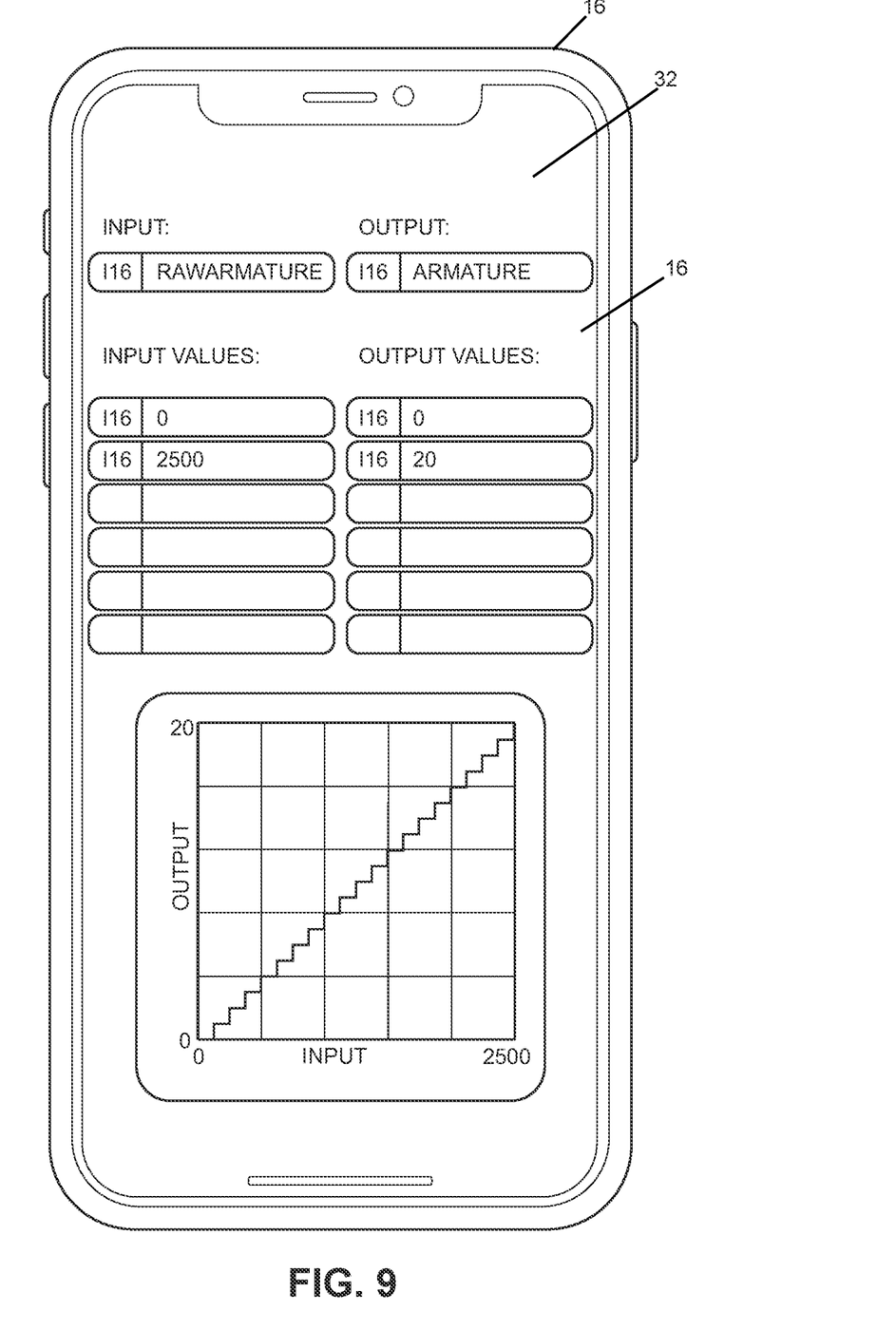

FIG. 9 depicts user interface 32 of screen 26 of electronic device 16 in electrical communication with novel electronic motor monitoring application of electronic motor monitor 1 (not shown). FIG. 9 illustrates a simple scale converting the monitored raw armature data into a pressure value that is displayed on the remote electronic device 16. It is within the scope of this invention for the computer program for a subroutine to process data and convert it into a value that is displayed on a remote monitor. It is within the scope of this invention for a subroutine to be a sequence of program instructions that performs a specific task, packaged as a unit.

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

It will thus be seen that the objects set forth above, and those made apparent from the foregoing description, are efficiently attained. Since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall therebetween.

The invention claimed is:

1. A system for monitoring parameters of a brushed electric DC motor, comprising:
   the brushed electric DC motor having an outer wall surface, the outer wall surface being a housing;
   a load, the load is coupled to an electric motor, the load is a pump;
   a power source;
   a first power line, the first power line has one end connected to the power source and another end connected to the electric motor;
   one or more sensors, at least one of the one or more sensors connected to the housing of the brushed electric DC motor;
   a current sensor, the current sensor is located external to the housing of the brushed electric DC motor, and wherein;
   an electronic device, the electronic device having a display with a user interface;
   a mounting structure, the mounting structure connected to the housing of the brushed electric DC motor, the mounting structure is positioned between a first terminal of a first brush of the brushed electric DC motor and a second terminal of a second brush of the brushed electric DC motor;
   an electric motor monitor, the electric motor monitor is connected external to the housing of the brushed electric DC motor, wherein the electric motor monitor is connected to the mounting structure, the electric motor monitor having a printed circuit board comprising:
      a current signal processor, the current signal processor is electrically connected to the current sensor and measures amperage of the electric motor;
      a memory device, the memory device is electrically connected to the current signal processor, the memory device is electrically connected to the first terminal of the first brush of the brushed electric DC motor and the second terminal of the second brush of the brushed electric DC motor; and,
      a communication system, the communication system is electrically connected to the memory device, the communication system is in communication with the electronic device, the communication system is configured to generate an RF communication link signal capable of delivering signal data from the current sensor to the electronic device;
   a current interruption device, the current interruption device being a relay, the relay is electrically connected external to the housing of the electric motor, the relay is electrically connected to the memory device of the electric motor monitor, the memory device is configured to orient the relay in a closed orientation to allow current to flow from the power source to the electric motor; and
   a second power line, the second power line has one end connected to the power source located opposite another end connected to the relay.

2. The system of claim 1, wherein the memory device is configured to orient the relay in an open orientation to interrupt a flow of current from the power source to the electric motor responsive to the memory device transmitting an alert to the electronic device when an irregularity is detected.

\* \* \* \* \*